(12) United States Patent
Kimball et al.

(10) Patent No.: US 7,994,794 B2
(45) Date of Patent: *Aug. 9, 2011

(54) METHODS FOR MEASURING A SET OF ELECTRICAL CHARACTERISTICS IN A PLASMA

(75) Inventors: Christopher Kimball, Fremont, CA (US); Eric Hudson, Berkeley, CA (US); Douglas Keil, Fremont, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/786,405

(22) Filed: May 24, 2010

(65) Prior Publication Data

US 2010/0229372 A1    Sep. 16, 2010

Related U.S. Application Data

(63) Continuation of application No. 11/948,926, filed on Nov. 30, 2007, now Pat. No. 7,723,994, which is a continuation of application No. 11/172,014, filed on Jun. 29, 2005, now Pat. No. 7,319,316.

(51) Int. Cl.
*G01N 27/26* (2006.01)
*H05B 31/26* (2006.01)

(52) U.S. Cl. .................................. 324/464; 315/111.21

(58) Field of Classification Search .................. 324/464; 315/111.21
See application file for complete search history.

(56) References Cited

U.S. PATENT DOCUMENTS

| 4,594,111 | A | 6/1986 | Coonan |
| 4,610,075 | A | 9/1986 | Eriksson |
| 5,364,219 | A | 11/1994 | Takahashi et al. |
| 5,391,275 | A | 2/1995 | Mintz |
| 5,492,569 | A | 2/1996 | Nakada |

(Continued)

FOREIGN PATENT DOCUMENTS

EP             261347          3/1988

(Continued)

OTHER PUBLICATIONS

"Non Final Office Action", U.S. Appl. No. 11/948,926, Mailing Date: Aug. 3, 2009.

(Continued)

*Primary Examiner* — Timothy J Dole
(74) *Attorney, Agent, or Firm* — IP Strategy Group, P.C.

(57) ABSTRACT

Methods using a probe apparatus configured to measure a set of electrical characteristics in a plasma include providing a chamber wall including at least a set of plasma chamber surfaces configured to be exposed to a plasma, the plasma having a set of electrical characteristics. The method includes installing a collection disk structure configured to be exposed to the plasma, wherein the collection disk structure having at least a body disposed within the chamber wall and a collection disk structure surface that is either coplanar or recessed with at least one of the set of plasma chamber surfaces and providing a conductive path configured to transmit the set of electrical characteristics from the collection disk structure to a set of transducers. The method may include coupling a thermal grounding element with the conductive path for providing thermal grounding to at least the conductive path and may alternatively or additionally include disposing an insulation barrier configured to substantially electrically separate at least one of the collection disk and the conductive path.

34 Claims, 5 Drawing Sheets

U.S. PATENT DOCUMENTS

| | | | | |
|---|---|---|---|---|
| 5,705,931 | A * | 1/1998 | Klick | 324/464 |
| 5,861,752 | A * | 1/1999 | Klick | 324/464 |
| 5,936,413 | A * | 8/1999 | Booth et al. | 324/464 |
| 6,120,660 | A | 9/2000 | Chu et al. | |
| 6,135,697 | A | 10/2000 | Isaacs et al. | |
| 6,184,623 | B1 * | 2/2001 | Sugai et al. | 315/111.21 |
| 6,356,097 | B1 * | 3/2002 | Loewenhardt et al. | 324/765 |
| 6,380,612 | B1 | 4/2002 | Jang et al. | |
| 6,388,382 | B1 | 5/2002 | Doi et al. | |
| 6,559,650 | B2 * | 5/2003 | Coumou | 324/468 |
| 6,810,548 | B2 | 11/2004 | Yoshioka et al. | |
| 6,841,963 | B2 | 1/2005 | Song et al. | |
| 6,894,474 | B2 * | 5/2005 | Cox et al. | 324/464 |
| 6,902,646 | B2 * | 6/2005 | Mahoney et al. | 156/345.24 |
| 6,973,856 | B2 | 12/2005 | Shibata | |
| 7,319,316 | B2 | 1/2008 | Kimball et al. | |
| 2001/0006870 | A1 | 7/2001 | Moore | |
| 2002/0100557 | A1 | 8/2002 | Li et al. | |
| 2002/0104751 | A1 | 8/2002 | Drewery et al. | |
| 2002/0121291 | A1 | 9/2002 | Daum et al. | |
| 2003/0207655 | A1 | 11/2003 | Jackson | |
| 2003/0227283 | A1 * | 12/2003 | Cox et al. | 324/71.1 |
| 2004/0060657 | A1 | 4/2004 | Saigusa et al. | |
| 2004/0134518 | A1 | 7/2004 | Kraus et al. | |
| 2005/0014380 | A1 | 1/2005 | Kai et al. | |
| 2005/0225248 | A1 | 10/2005 | Fink et al. | |
| 2006/0130758 | A1 | 6/2006 | Lohokare | |
| 2006/0218680 | A1 | 9/2006 | Bailey, III | |
| 2008/0066861 | A1 | 3/2008 | Kimball et al. | |

FOREIGN PATENT DOCUMENTS

| | | |
|---|---|---|
| EP | 0792571 B1 | 9/1996 |
| EP | 0801413 A1 | 10/1997 |
| FR | 2738984 A1 | 9/1995 |
| WO | WO-97/11587 A1 | 3/1997 |
| WO | WO-03/029513 | 4/2003 |

OTHER PUBLICATIONS

"International Search Report", Application No. PCT/US2005/45729; Mailing Date: May 28, 2008.
"International Preliminaiy Report on Patentability", Application No. PCT/US2005/45729; Mailing Date: Jul. 17, 2008.
"Written Opinion", Application No. PCT/US2005/45729; Mailing Date: May 28, 2008.
"Final Office Action", U.S. Appl. No. 11/022,982, Correspondence Date: Nov. 3, 2008.
"Non Final Office Action", U.S. Appl. No. 11/022,982, Correspondence Date: May 13, 2008.
"International Search Report", Application No. PCT/US 06/10577, Mailing Date: Sep. 13, 2007.
"Written Opinion", Application No. PCT/US 06/10577, Mailing Date: Sep. 13, 2007.
"International Preliminary Report on Patentability", Application No. PCT/US 06/10577, Mailing Date: Oct. 18, 2007.
"Final Office Action", U.S. Appl. No. 11/092,848, Correspondence Date: Sep. 15, 2008.
"Non Final Office Action", U.S. Appl. No. 11/092,848, Correspondence Date: Mar. 11, 2008.
"Non Final Office Action", U.S. Appl. No. 11/092,848, Correspondence Date: Jun. 13, 2007.
"Final Office Action", U.S. Appl. No. 11/092,848, Correspondence Date: Oct. 3, 2007.
Siegerman, Howard "Applying Process-Specific Approaches to Performing Tool Preventive Maintenance", http://www.micromagazine.com/archive/01/10/tool.html, 9pp, Jan. 16, 2005.
"Robotic Assembly for the 21st Century", Automation Technologies Council, 16pp.
Derby, et al., "A High Precision Robotic Docking End Effector: The Dockbot", Distributed Robotics LLC, 4pp.
"Introduction to Industrial Robots", Warwick Manufacturing Group, 1993, 10pp.
"Characteristics Arm-TX Series 40 Family", 2004 Staubli Faverges, pp. 1-34.
"Module 3 Robotics Teohnology", NSF/USF Stars, 7pp.
Barnes, Nick "Docking", http://homepages.inf.ed.ac.uk/rbf/CVonline/LOCAL_COPIES/BARNES, 5pp, Jan. 17, 2005.
Braithwaite et al. "Transient Rfself-bias in electropositive and electronegative plasmas",(2003) , J. Phys. D: Appl. Phys, 36 pp. 2837-2844.
"Robot Navigation Technology", Helpmate Robotics, Inc., 4pp.
"Chapter 1: Introduction", Aug. 17, 2000, pp. 1-32.
"Chapter 2: The Manufacturing Process", Sep. 4, 2000, pp. 33-62.
"Chapter 3: the Devices", Sep. 6, 1999, pp. 43-97.
"Chapter 4: The Wire", Sep. 6, 1999, pp. 103-143.
"Chapter 5: The CMOS Inverter", Sep. 6, 1999, pp. 144-192.
Labombard, et al., "Cross-field Plasma Transport and Main-chamber Recycling in Diverted Plasmas on Alcator C-Mod", 28 pages total, http://epub.iaea.org/fusion/subscribe/40/dec/ms6940LabomB/6940.html, Oct. 17, 2004.
Rees, et al., "Processing Plasmas Face a Testing Time", 4 pages total.
Carter, William P., "Research Plan for Next Generation Environmental Chamber Facility for Chemical Mechanism and VOC Reactivity Evaluation", pp. 1-19.
Chang, et al., "Plasma-surface Interactions", J. Vac. Sci. Technol. A 21(5), Sep./Oct. 2003, pp. S145-S151.
Jean-Paul Booth, "Diagnostics of etching plasmas", (2002), Pure Appl. Chem., vol. 74, No. 3, pp. 397-400.
May, Paul "MSc Physics of Advanced Semiconductor Materials: Plasmas and Plasma Processing", 9 pages total, Oct. 25, 2004.
"Chapter 3: Epitaxy", City University of Hong Kong, pp. 1-24.
Sobolewski, et al., "Electrical Optimization of Plasma-enhanced Chemical Vapor Deposition Chamber Cleaning Plasmas", J. Vac. Sci. Technol. B 16(1), Jan./Feb. 1998, pp. 173-182.
Chu, Paul "Chapter 10: Metallization", City University of Hong Kong, 51 total pages.
Nelson, et al., "Yttrium Oxide Nanoparticles prepared by Alkalide Reduction", Chem. Mater., vol. 14 No. 2, 2002, pp. 915-917.
Horiuchi, et al., "In-Situ Chamber Wall Cleaning in Processing Plasmas", 4 pages total.
"Reducing PFC Gas Emissions from CVD Chamber Cleaning", Solid State Technology, Dec. 2000 Edition, 6 pages total.
Chu, et al., "Third-generation Plasma Immersion Ion Implanter for Biomedical Materials and Research", Review of Scientific Instruments, vol. 72, No. 3, Mar. 2001, pp. 1660-1665.
"Chapter 9: Trench Filling by Physical Vapor Deposition", pp. 138-173.
Dobkin, Daniel M., "Plasmas and Deposition", 4 pages total, http://www.batnet.com/enigmatics/semiconductor_processing/CVD_Fundamentals/plasmas/plasma_deposition.html, Oct. 17, 2004.
"Hydrogen Peroxide (H2O2): The Amazing Secrets That They Don't Want You to Know!", 6 pages total, http://www.h2o2-4u.com, Aug. 13, 2003.
Harpold, et al., "How Advanced Energy, MDX TM Products Manage Arcs", Advanced Energy, pp. 1.
Montgomery, Steven "Higher Profits from Intelligent Semiconductor Equipment Maintenance: 'The Source of the Maintenance Problem'", Future Fab International, Issue 17, 9 pages total, http://www.future-fab.com/documents.asp?d_ID=1226, Oct. 15, 2004.
Rossnagel, S. M., "Sputter Deposition for Semiconductor Manufacturing", IBM Journal of Research and Development, vol. 14, 1/2, 1999, pp. 1-14, http://www.research.ibm.com/journal/rd/431/rossnagel.html.
Nickerson, et al., "Plasma Cleaning of Medical Devices", Jun. 2000, 4 total pages.
Friz, et al., "Coating Materials", pp. 105-130.
"Section 4: Examples of Waste Minimization/Pollution Prevention Techniques", pp. 1-26, http://www.p2pays.org/ref/02/01844/sec_4.txt, Oct. 14, 2004.
Yeoh, et al., "Photoresist Strip on Orion 2.2 TM in Via First Dual Damascene Cu Structures", 3 pages total.
"The Self Clean Chemistry Concept (I)", No Publication or Website known. 1 page total, Oct. 15, 2004.
Yang, Yao-Joe "Thin Film Process", 11 pages total, 21 slides, No Publication or Website known.
"Evaporation", 7 pages total, 26 slides, Sep. 21, 2001.

"Non Final Office Action", U.S. Appl. No. 11/022,982, Mailing Date: Dec. 31, 2008.

"Non Final Office Action", U.S. Appl. No. 11/092,848, Mailing Date: Feb. 25, 2009.

"Final Office Action", U.S. Appl. No. 11/092,848, Correspondence Date: Jul. 31, 2009.

"International Search Report", Application No. PCT/US06/23027; Mailed Sep. 25, 2007.

"Written Opinion", Application No. PCT/US06/23027; Mailed Sep. 25, 2007.

"International Preliminary Report on Patentability", Application No. PCT/US06/23027; Mailed Jan. 17, 2008.

"Non Final Office Action", U.S. Appl. No. 11/022,982, Mailing Date: May 21, 2009.

"Final Office Action", U.S. Appl. No. 11/022,982, Mailing Date: Jul. 14, 2010.

Braithwaite et al., "A Novel Electrostatic Probe Method for Ion Flux Measurements", (1996), Plasma Sources Sci. Technol. 5 pp. 677-684.

Booth et al., "Measurements of characteristic transients of planar electrostatic probes in cold plasmas",(Jul. 2000), Rev. Sci. Instrum., vol. 71, No. 7.

* cited by examiner

METHODS FOR MEASURING A SET OF ELECTRICAL CHARACTERISTICS IN A PLASMA

PRIORITY APPLICATIONS

This application is a continuation application of and claims the benefit under 35 USC 120 to application Ser. No. 11/948,926, filed on Nov. 30, 2007 by inventors Christopher Kimball, Eric Hudson, Douglas Keil, and Alexei Marakhtanov (to be issued as U.S. Pat. No. 7,723,994 on May 25, 2010), which itself is a continuation of and claims benefit under 35 USC 120 to application Ser. No. 11/172,014, filed on Jun. 29, 2005 by inventors Christopher Kimball, Eric Hudson, Douglas Keil, and Alexei Marakhtanov (now issued as U.S. Pat. No. 7,319,316).

BACKGROUND OF THE INVENTION

The present invention relates in general to substrate manufacturing technologies and in particular to apparatus for measuring a set of electrical characteristics in a plasma.

In the processing of a substrate, e.g., a semiconductor wafer, MEMS device, or a glass panel such as one used in flat panel display manufacturing, plasma is often employed. As part of the processing of a substrate (chemical vapor deposition, plasma enhanced chemical vapor deposition, physical vapor deposition, etch, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$, etc.) are then flowed into the chamber and struck to form a plasma to etch exposed areas of the substrate.

Subsequently, it is often beneficial to measure the electrical characteristics in a plasma (i.e., ion saturation current, electron temperature, floating potential, etc.) in order to ensure consistent plasma processing results. Examples may include detecting the endpoint of a chamber conditioning process, chamber matching (e.g., looking for differences between chambers which should nominally be identical), detecting faults and problems in the chamber, etc.

Referring now to FIG. 1, a simplified diagram of an inductively coupled plasma processing system is shown. Generally, an appropriate set of gases may be flowed from gas distribution system 122 into plasma chamber 102 having plasma chamber walls 117. These plasma processing gases may be subsequently ionized at or in a region near injector 109 to form a plasma 110 in order to process (e.g., etch or deposit) exposed areas of substrate 114, such as a semiconductor substrate or a glass pane, positioned with edge ring 115 on an electrostatic chuck 116.

A first RF generator 134 generates the plasma as well as controls the plasma density, while a second RF generator 138 generates bias RF, commonly used to control the DC bias and the ion bombardment energy. Further coupled to source RF generator 134 is matching network 136a, and to bias RF generator 138 is matching network 136b, that attempt to match the impedances of the RF power sources to that of plasma 110. Furthermore, vacuum system 113, including a valve 112 and a set of pumps 111, is commonly used to evacuate the ambient atmosphere from plasma chamber 102 in order to achieve the required pressure to sustain plasma 110 and/or to remove process byproducts.

Referring now to FIG. 2, a simplified diagram of a capacitively coupled plasma processing system is shown. Generally, capacitively coupled plasma processing systems may be configured with a single or with multiple separate RF power sources. Source RF, generated by source RF generator 234, is commonly used to generate the plasma as well as control the plasma density via capacitively coupling. Bias RF, generated by bias RF generator 238, is commonly used to control the DC bias and the ion bombardment energy. Further coupled to source RF generator 234 and bias RF generator 238 is matching network 236, which attempts to match the impedance of the RF power sources to that of plasma 220. Other forms of capacitive reactors have the RF power sources and match networks connected to the top electrode 204. In addition there are multi-anode systems such as a triode that also follow similar RF and electrode arrangements.

Generally, an appropriate set of gases is flowed through an inlet in a top electrode 204 from gas distribution system 222 into plasma chamber 202 having plasma chamber walls 217. These plasma processing gases may be subsequently ionized to form a plasma 220, in order to process (e.g., etch or deposit) exposed areas of substrate 214, such as a semiconductor substrate or a glass pane, positioned with edge ring 215 on an electrostatic chuck 216, which also serves as an electrode. Furthermore, vacuum system 213, including a valve 212 and a set of pumps 211, is commonly used to evacuate the ambient atmosphere from plasma chamber 202 in order to achieve the required pressure to sustain plasma 220.

In view of the foregoing, there are desired apparatus for measuring a set of electrical characteristics in a plasma.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
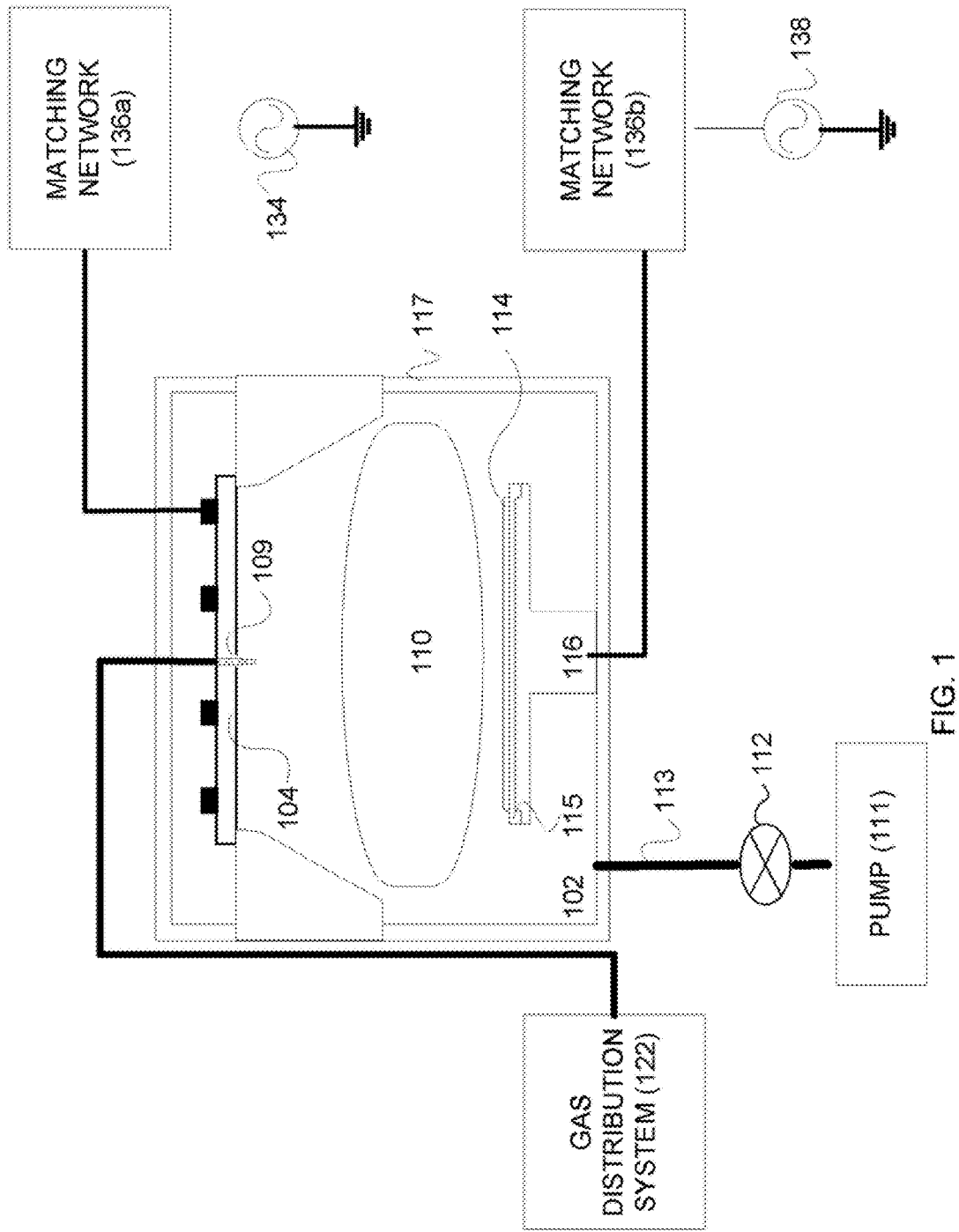
FIG. 1 illustrates a simplified diagram of an inductively coupled plasma processing system.
Figure 2:
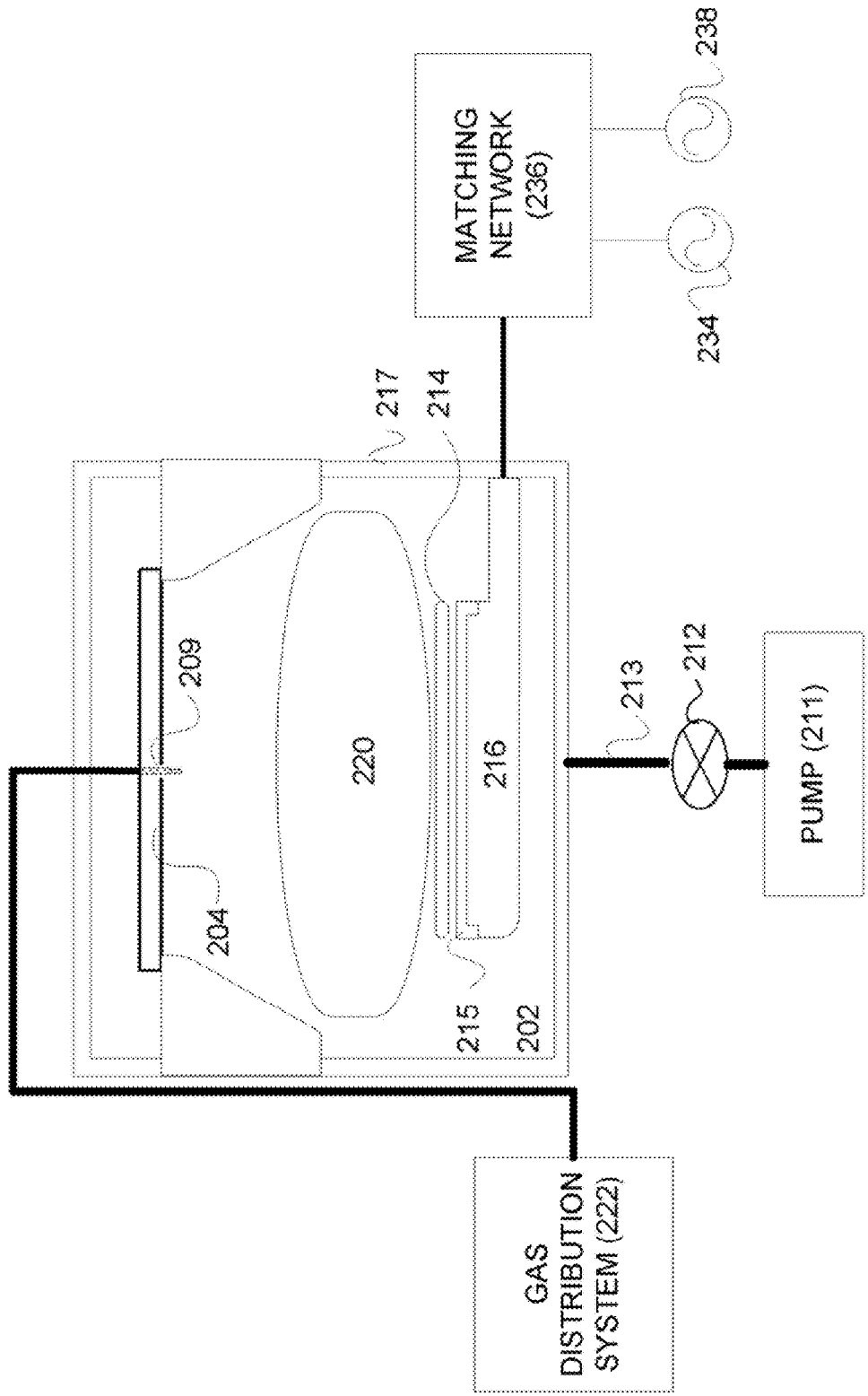
FIG. 2 illustrates a simplified diagram of a capacitively coupled plasma processing system.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that a set of electrical characteristics of a plasma in a plasma processing system may be determined by measuring ion flux with a sensor that is substantially coplanar with the plasma chamber surface or, alternatively, a sensor that is recessed into a plasma chamber wall.

Flux is generally defined as the rate at which a given quantity passes through a fixed boundary per unit time. For a plasma processing system, ion flux commonly signifies the energy per unit time (or power) created by ions in a plasma passing through a plasma chamber surface or boundary. Subsequently, this plasma-surface (Or boundary) interaction may be analyzed in order to determine a set of electrical characteristics in the plasma itself.

Coplanar refers to the position of the sensor in relation to a plasma chamber surface, wherein a measuring surface of the sensor and the surface of the plasma chamber are substantially on the same plane. Recessed refers to the position of the sensor in relation to a plasma chamber surface, wherein the surface of the plasma chamber is between the measuring surface of the sensor and the plasma.

Unlike other indirect measurement techniques, such as the use of a non-coplanar or non-recessed interferometer which are subject to distortion, a coplanar or recessed sensor can directly measure a condition inside the plasma chamber. For example, a coplanar ion flux probe may be used to detect the endpoint of a chamber conditioning process, to measure plasma properties (e.g., ion saturation current, electron temperature, floating potential, etc.), for chamber matching (e.g., looking for differences between chambers which should nominally be identical), for detecting faults and problems in the chamber, etc.

In an embodiment, the parts of the probe exposed to plasma and reactive gases are composed of materials which do not contaminate the plasma with particles or unwanted chemicals. For example in a dielectric etching system, suitable materials would include silicon, silicon dioxide, and fluoropolymers. In addition, in order to properly function, the connection between the conductive surface of the probe and the powering/sensing electronics (e,g, transducers, etc.) should have a low and stable resistance, when cycled between room temperature and elevated temperatures (routinely at or above 200° C.) commonly found in plasma processing.

Figure 3:
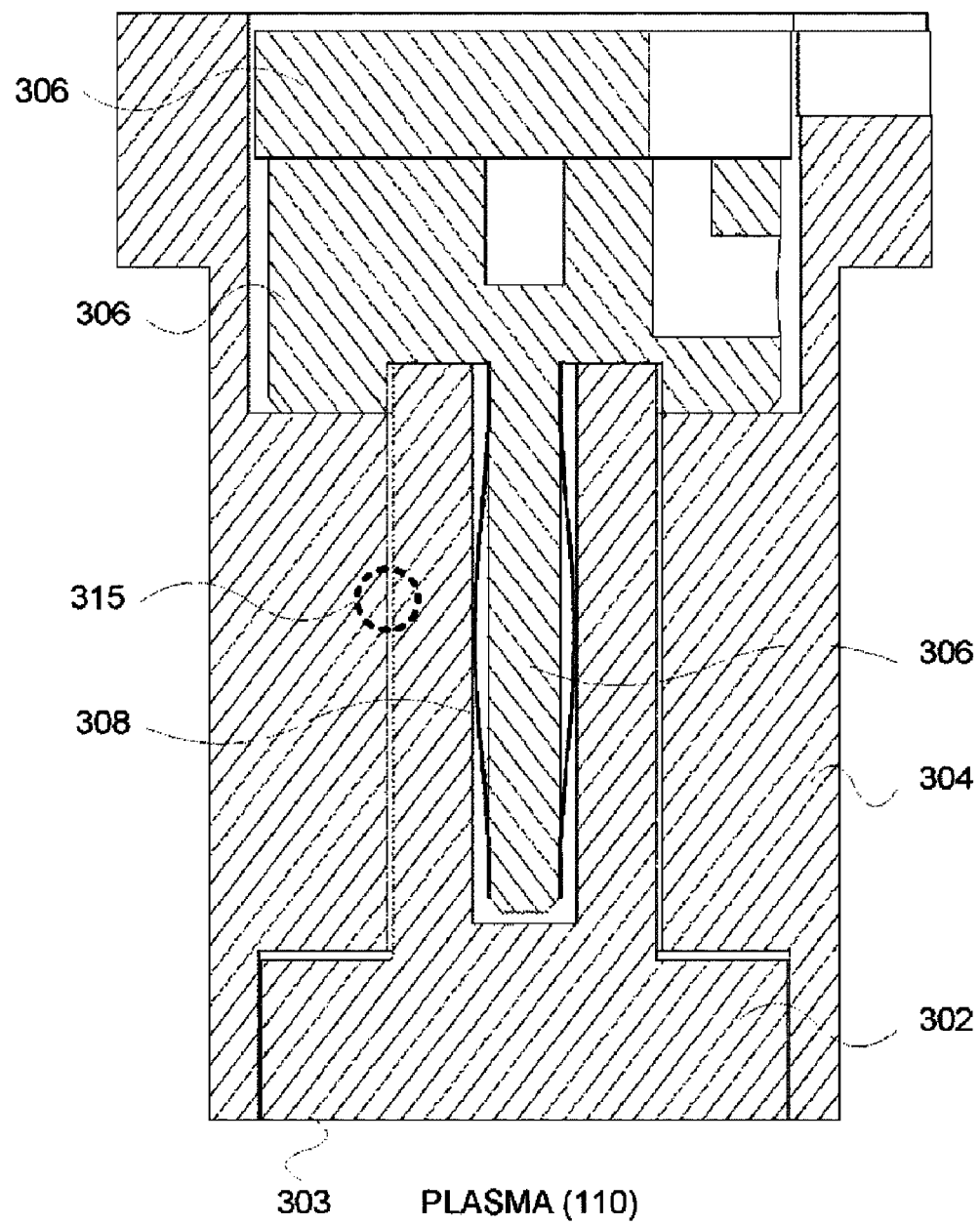
FIG. 3 illustrates a simplified diagram of a probe, according to an embodiment of the invention.

Referring now to FIG. 3, a simplified diagram of a probe is shown, according to an embodiment of the invention. In general, the probe is comprised of a collection disk structure, a conductive path, and an insulation barrier. The collection disk structure 302 faces the plasma and is generally constructed of a conductive surface area 303 that is coplanar with or recessed with respect to a plasma chamber surface. In an embodiment, collection disk structure 302 is comprised of metalized silicon. Collection disk structure 302 is further coupled to conductive path 306 which, in turn, is commonly connected to power/sensing electronics [not shown] that may measure I-V characteristics of the ion flux probe, as slow transient currents charge and discharge the capacitance. In an embodiment, the back surface (i.e. the surface in contact with conductive path 306) is sputtered with a metal. In an embodiment, conductive path 306 is comprised of aluminum. In an embodiment, conductive path 306 is comprised of stainless steel. In an embodiment, collection disk structure 302 is further coupled to conductive path 306 via a leaf spring 308. In an embodiment, leaf spring 308 is substantially cylindrical.

Further isolating collection disk structure 302 and conductive path 306 from the plasma chamber [not shown] are insulation barrier 304 and a gap 315. In an embodiment, insulation barrier 304 is a ground shield. In an embodiment, insulation barrier 304 comprises a dielectric, such as quartz. In an embodiment, insulation barrier 304 comprises ceramic such as aluminum nitride, aluminum oxide, etc. In an embodiment, insulation barrier 304 comprises an air (vacuum) gap which is small enough to prevent plasma forming within the gap, but large enough to prevent arcing between conductive path 306 and plasma chamber [not shown].

Figure 4:
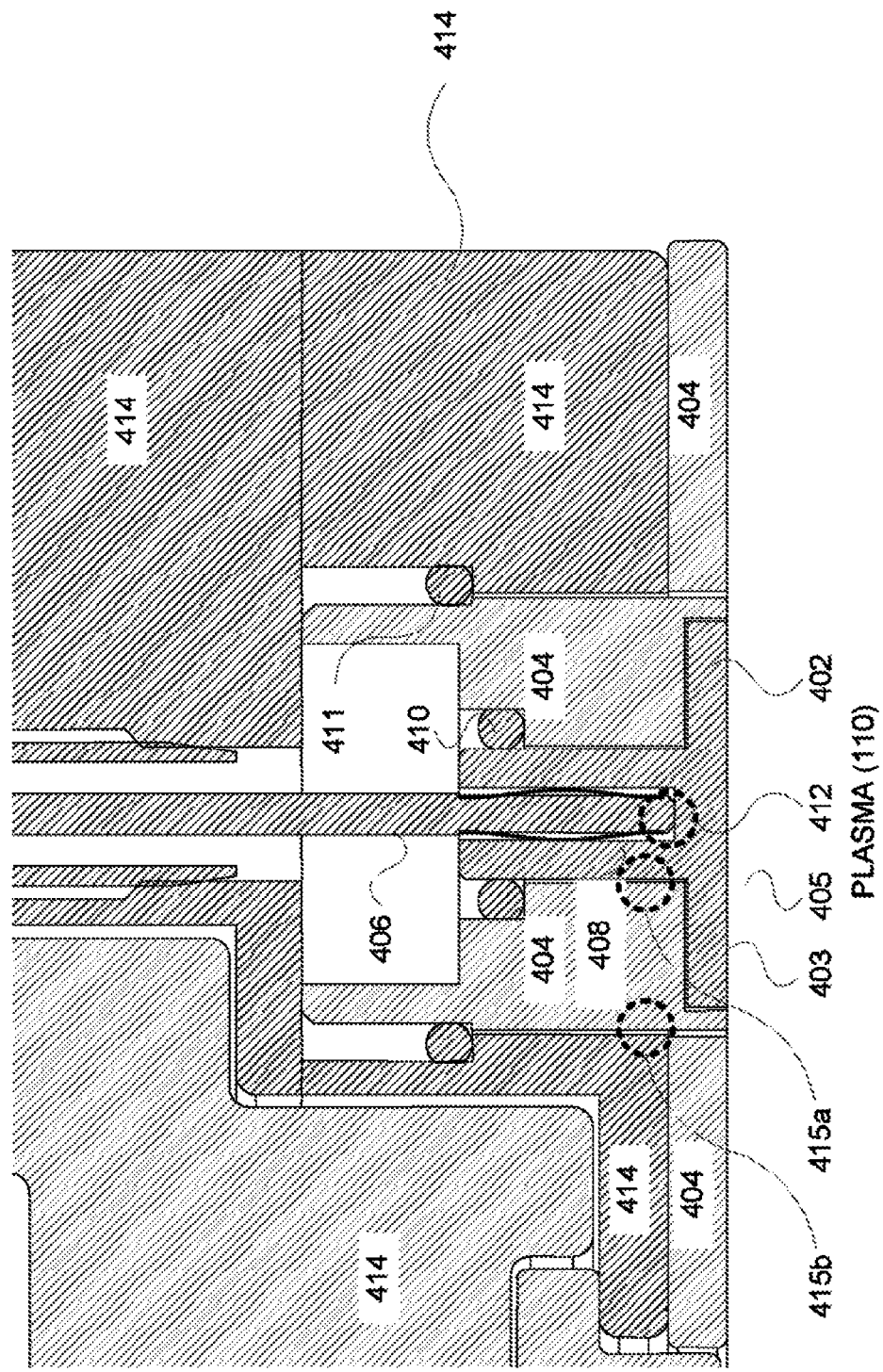
FIG. 4 illustrates a simplified diagram of a probe, in which direct contact is made between a conductive path and a collection disk structure, according to an embodiment of the invention; and, FIG. 5 illustrates a simplified diagram of a conductive path including a wire, according to an embodiment of the invention.

Referring now to FIG. 4, a simplified diagram of a probe is shown, in which direct contact is made between a conductive path and a collection disk structure, according to an embodiment of the invention. In general, as before, the probe is comprised of a collection disk structure, a conductive path, and an insulation barrier. The collection disk structure 402 faces the plasma 110 and is generally constructed of a conductive surface area 403 that is coplanar with or recessed with respect to a plasma chamber surface.

In an embodiment, collection disk structure 402 is comprised of metalized silicon. In general, metalized silicon is preferable to more commonly used probe materials, such as tungsten and aluminum oxide, which may contaminate the plasma. Collection disk structure 402 is further coupled to conductive path 406 which, in turn, is commonly connected to power/sensing electronics [not shown] that may measure I-V characteristics of the ion flux probe, as slow transient currents charge and discharge the capacitance. In an embodiment, the back surface 412 (i.e. the surface in contact with conductive path 406) is sputtered with a metal. In an embodiment, conductive path 406 is comprised of aluminum. In an embodiment, conductive path 406 is comprised of stainless steel. In an embodiment, collection disk structure 402 is further coupled to conductive path 406 via a leaf spring 408. In an embodiment, leaf spring 408 is substantially cylindrical. Further isolating collection disk structure 402 and conductive path 406 from the plasma chamber [not shown] is insulation barrier 404. In an embodiment, insulation barrier 404 is a ground shield. In an embodiment, insulation barrier 404 comprises quartz. In an embodiment, insulation barrier 404 comprises ceramic such as aluminum nitride, aluminum oxide, etc In an embodiment, a gap 415a exists between conductive path 406 and insulation barrier 404 in order to provide space for thermal expansion. In an embodiment, gap 415a is small enough to prevent plasma forming within the gap. In an embodiment, a gap 415b exists between insulation barrier 404 and plasma chamber wall structure 414 in order to provide space for thermal expansion. In an embodiment, gap 415b is small enough to prevent plasma forming within the gap.

In an embodiment, an O-ring 410 is positioned between collection disk structure 402 and insulation barrier 404. In an embodiment, an O-ring 411 is positioned between collection insulation barrier 404 and the plasma chamber wall structure 414. In an embodiment, O-ring 410 and O-ring 411 are comprised of a perfluoronated elastomer (i.e., Perlast®, Parofluor®, Kahez®, etc.). In an embodiment, O-ring 410 and O-ring 411 are comprised of Teflon. In an embodiment, O-ring 410 substantially reduces arcing or light up in gaps between collection disk structure 402 and conductive path 406. In an embodiment, O-ring 411 substantially reduces arcing or light up in gaps between and conductive path 406 and insulation barrier 404. In an embodiment, O-rings 410 and 411 may substantially reduce contamination of the plasma from metal that may have been sputtered on the back surface of collection disk structure 402, as previously described.

In an embodiment, the temperature of the probe is substantially the same as the temperature of the plasma chamber. In general, because plasma recipes tend to be highly sensitive to temperature fluctuations of components in a plasma processing system (i.e., etch quality, etc.) temperature uniformity is beneficial.

In an embodiment a layer of thermally conductive adhesive is placed between conductive path 406 and insulation barrier 404. In an embodiment, closed loop control of temperature may be accomplished by embedding a thermocouple [not shown] in disk structure 402, and a resistive wire [not shown] around conductive path 406

Figure 5:
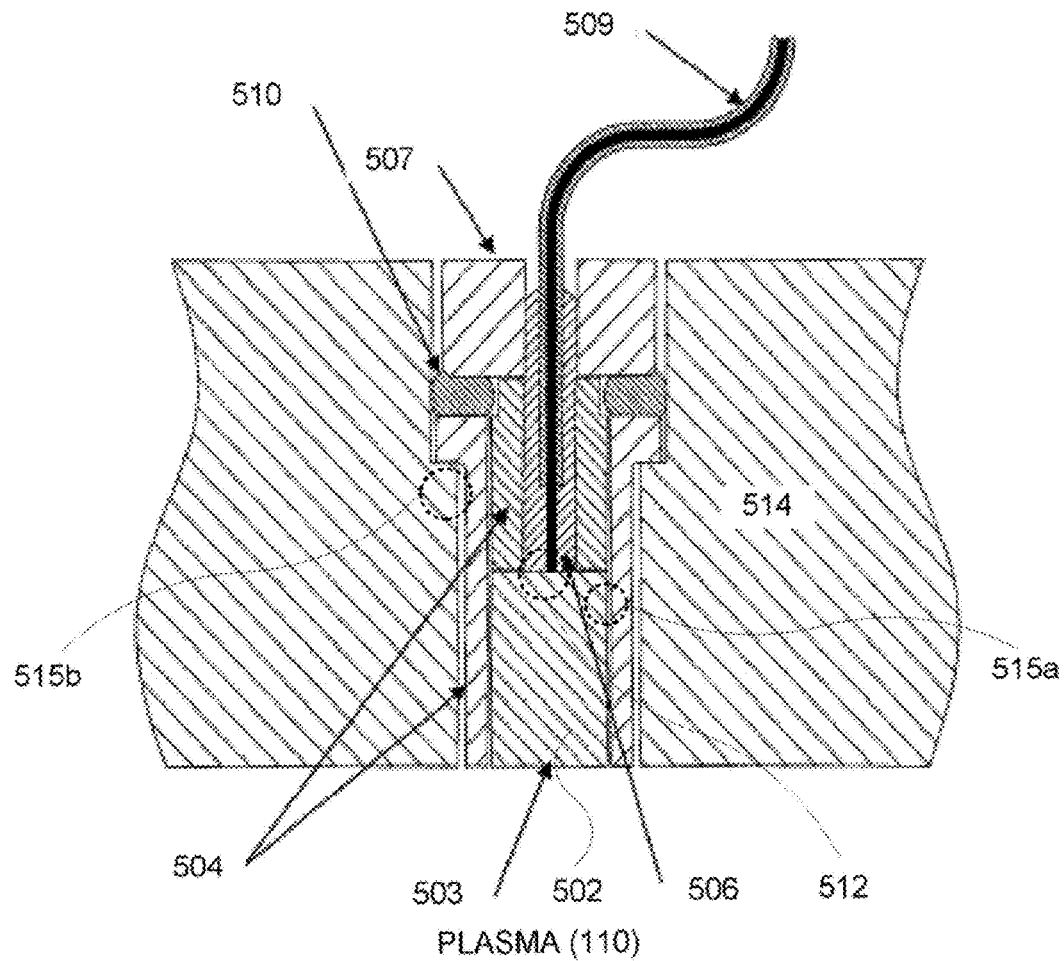

Referring now to FIG. 5, conductive path includes a wire, according to an embodiment of the invention. In general, as before, the probe is comprised of a collection disk structure 502, a conductive path 506, and an insulation barrier 504. The collection disk structure 502 faces the plasma 110 and is generally constructed of a conductive surface area 503 that is coplanar to or recessed with a plasma chamber surface.

In an embodiment, collection disk structure 502 is comprised of metalized Collection disk structure 502 is further coupled to conductive path 506 which, in turn, is commonly connected to power/sensing electronics [not shown] that may measure I-V characteristics of the ion flux probe, as slow transient currents charge and discharge the capacitance. In an embodiment, the back surface (i.e. the surface in contact with conductive path 506) is sputtered with a metal. In an embodiment, conductive path 506 is comprised of aluminum. In an embodiment, conductive path 506 is comprised of stainless steel. Further isolating collection disk structure 502 and conductive path 506 from the plasma chamber 514 is insulation barrier 504. In an embodiment, insulation barrier 504 is a ground shield. In an embodiment, insulation barrier 504 comprises quartz. In an embodiment, insulation barrier 504 comprises ceramic, such as aluminum nitride, aluminum oxide, etc. In an embodiment, insulation barrier 504 comprises an air gap which is small enough to prevent plasma forming within the gap, but large enough to prevent arcing between conductive path 1006 and plasma chamber 514

In an embodiment, an O-ring 510 is positioned between collection disk structure 502 and the plasma chamber wall structure 514. In an embodiment, O-ring 510 is comprised of a perfluoronated elastomer (i.e., Perlast®, Parofluor®, Kalrez®, etc.). In an embodiment, O-ring 510 is comprised of Teflon. In an embodiment, O-ring 510 provides pressure between the back of the probe 507 and the plasma chamber [not shown]. Such pressure substantially improves the ability of the probe to dissipate heat during operation.

In an embodiment, the temperature of the probe is substantially the same as the temperature of the plasma chamber. In an embodiment a layer of thermally conductive adhesive is placed between conductive path 506 and insulation barrier 504. In an embodiment, closed loop control of temperature may be accomplished by embedding a thermocouple [not shown] in disk structure 502, and a resistive wire [not shown] around conductive path 506. In an embodiment, conductive path 506 includes a wire 509 connected to the power/sensing electronics. In an embodiment, the wire is connected to conductive path 506 with a screw. In an embodiment, the wire is connected to conductive path 406 with a BNC connector [not shown]. In an embodiment, conductive path 506 directly physically contacts collection disk structure 502 at 512.

In an embodiment, the probe bias is not substantially biased above the nominal floating potential, the probe bias being generally derived entirely from the plasma in conjunction with applied RF potentials. In an embodiment, thermal grounding of the probe may be accomplished by the use of pressure and materials which provide low thermal contact resistance, such as graphite 507. In an embodiment, closed loop control of temperature may be accomplished by embedding a thermocouple [not shown] in disk structure 502, and a resistive wire [not shown] around conductive path 506.

While this invention has been described in terms of several preferred embodiments, there are alterations, permutations, and equivalents which fall within the scope of this invention. It should also be noted that there are many alternative ways of implementing the methods of the present invention.

Advantages of the invention include an apparatus for measuring a set of electrical characteristics in a plasma. Additional advantages include the maintenance of substantial temperature uniformity between the probe and a plasma chamber surface, and the avoidance of materials such as tungsten and aluminum oxide which may contaminate the plasma environment.

Having disclosed exemplary embodiments and the best mode, modifications and variations may be made to the disclosed embodiments while remaining within the subject and spirit of the invention as defined by the following claims.

What is claimed is:

1. A method to configure a plasma processing chamber for processing at least a substrate therein, comprising;
   providing a chamber wall including at least a set of plasma chamber surfaces configured to be exposed to a plasma, said plasma having a set of electrical characteristics;
   installing a collection disk structure configured to be exposed to said plasma, wherein said collection disk structure having at least a body disposed within said chamber wall and a collection disk structure surface coplanar with at least one of said set of plasma chamber surfaces;
   providing a conductive path electrically communicating with said collection disk structure, and configured to transmit said set of electrical characteristics from said collection disk structure to a set of transducers; and
   coupling a thermal grounding element with said conductive path for providing thermal grounding to at least said conductive path.

2. The method of claim 1, wherein said electrical characteristics includes at least one of voltage, phase, and current.

3. The method of claim 1, wherein said collection disk structure is formed of a material that includes at least metalized silicon.

4. The method of claim 1, wherein a back surface of said collection disk structure is sputtered with a metal to facilitate electrical connection with said conductive path.

5. The method of claim 1, wherein said collection disk structure is coupled to a surface of said conductive path using at least one leaf spring.

6. The method of claim 1, wherein said conductive path is formed of a material that includes at least one of aluminum and stainless steel.

7. The method of claim 1, further comprising providing an insulation barrier configured to substantially electrically separate at least one of said collection disk structure and said conductive path from said set of plasma chamber surfaces.

8. The method of claim 7, further comprising providing a gap between said conductive path and said insulation barrier.

9. The method of claim 8, wherein said gap is dimensioned such that said gap is insufficiently large to facilitate plasma presence in said gap.

10. The method of claim 7, further comprising providing a gap between said insulation barrier and at least one of said set of plasma chamber surfaces.

11. The method of claim 10, wherein said gap is dimensioned such that said gap is insufficiently large to facilitate plasma presence in said gap.

12. A method to configure a plasma processing chamber for processing at least a substrate therein, comprising;
providing a chamber wall including at least a set of plasma chamber surfaces configured to be exposed to a plasma, said plasma having a set of electrical characteristics;
installing a collection disk structure configured to be exposed to said plasma, wherein said collection disk structure having at least a body disposed within said chamber wall and a collection disk structure surface recessed with respect to a plasma chamber surface within which said collection disk structure is disposed;
providing a conductive path electrically communicating with said collection disk structure, and configured to transmit said set of electrical characteristics from said collection disk structure to a set of transducers; and
coupling a thermal grounding element with said conductive path for providing thermal grounding to at least said conductive path.

13. The method of claim 12, wherein said electrical characteristics includes at least one of voltage, phase, and current.

14. The method of claim 12, wherein said collection disk structure is formed of a material that includes at least metalized silicon.

15. The method of claim 12, wherein a back surface of said collection disk structure is sputtered with a metal to facilitate electrical connection with said conductive path.

16. The method of claim 12, wherein said collection disk structure is coupled to a surface of said conductive path using at least one leaf spring.

17. The method of claim 12, wherein said conductive path is formed of a material that includes at least one of aluminum and stainless steel.

18. The method of claim 12, further comprising providing an insulation barrier configured to substantially electrically separate at least one of said collection disk structure and said conductive path from said set of plasma chamber surfaces.

19. The method of claim 18, further comprising providing a gap between said conductive path and said insulation barrier.

20. The method of claim 19, wherein said gap, is dimensioned such that said gap is insufficiently large to facilitate plasma presence in said gap.

21. The method of claim 18, further comprising providing a gap between said insulation barrier and at least one of said set of plasma chamber surfaces.

22. The method of claim 21, wherein said gap is dimensioned such that said gap is insufficiently large to facilitate plasma presence in said gap.

23. A method to configure a plasma processing chamber for processing at least a substrate therein, comprising;
providing a chamber wall including at least a set of plasma chamber surfaces configured to be exposed to a plasma, said plasma having a set of electrical characteristics;
installing a collection disk structure configured to be exposed to said plasma, wherein said collection disk structure having at least a body disposed within said chamber wall and a collection disk structure surface being one of coplanar and recessed with respect to at least one of said set of plasma chamber surfaces;
coupling a conductive path to said collection disk structure, said conductive path configured to transmit said set of electrical characteristics from said collection disk structure to a set of transducers;
disposing an insulation barrier configured to substantially electrically separate at least one of said collection disk and said conductive path from said set of plasma chamber surfaces; and
placing a layer of thermally conductive adhesive between said conductive path and said insulation barrier.

24. The method of claim 23, wherein said electrical characteristics includes at least one of voltage, phase, and current.

25. The method of claim 23, wherein said collection disk structure is formed of a material that includes at least metalized silicon.

26. The method of claim 23, wherein a back surface of said collection disk structure is sputtered with a metal to facilitate electrical connection with said conductive path.

27. The method of claim 23, wherein said collection disk structure is coupled to a surface of said conductive path using at least one leaf spring.

28. The method of claim 23, further comprising providing a gap between said conductive path and said insulation barrier.

29. The method of claim 28, wherein said gap is dimensioned such that said gap is insufficiently large to facilitate plasma presence in said gap.

30. The method of claim 23, further comprising providing a gap between said insulation barrier and at least one of said set of plasma chamber surfaces.

31. The method of claim 30, wherein said gap is dimensioned such that said gap is insufficiently large to facilitate plasma presence in said gap.

32. The method of claim 23, wherein said insulation barrier comprises at least one of quartz, aluminum nitride, and ceramic.

33. The method of claim 23 wherein said collection disk structure surface is coplanar with respect to said at least one of said set of plasma chamber surfaces.

34. The method of claim 23 wherein said collection disk structure surface is recessed with respect to said at least one of said set of plasma chamber surfaces.

* * * * *